(12) United States Patent
Chiu et al.

(10) Patent No.: US 8,704,220 B2
(45) Date of Patent: Apr. 22, 2014

(54) ACTIVE DEVICE

(75) Inventors: Hao-Lin Chiu, Taipei (TW); Chi-Jui Lin, Hualien County (TW); Shu-Wei Tsao, Taipei (TW); Chun-Nan Lin, Changhua County (TW); Po-Liang Yeh, New Taipei (TW); Shine-Kai Tseng, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/444,860

(22) Filed: Apr. 12, 2012

(65) Prior Publication Data

US 2013/0119371 A1 May 16, 2013

(30) Foreign Application Priority Data

Nov. 11, 2011 (TW) .............................. 100141252 A

(51) Int. Cl.
*H01L 29/12* (2006.01)

(52) U.S. Cl.
USPC .................. 257/43; 257/57; 257/59; 257/72; 438/48; 438/149

(58) Field of Classification Search
USPC ............ 257/43, 57, 59, 72, E29.273; 438/48, 438/149
See application file for complete search history.

(56) References Cited

U.S. PATENT DOCUMENTS

| 8,242,494 | B2 | 8/2012 | Suzawa et al. |
| 8,598,635 | B2 | 12/2013 | Yamazaki |
| 2003/0141500 | A1 | 7/2003 | Amundson et al. |
| 2010/0102315 | A1 | 4/2010 | Suzawa et al. |
| 2011/0101356 | A1 | 5/2011 | Yamazaki |
| 2012/0286266 | A1 | 11/2012 | Zawa et al. |
| 2013/0075717 | A1* | 3/2013 | Tsang .............................. 257/43 |

FOREIGN PATENT DOCUMENTS

| JP | 9-260675 | 10/1997 |
| TW | 201034086 | 9/2010 |
| TW | 201036073 | 10/2010 |
| TW | 201135930 | 10/2011 |
| TW | 201320338 | 5/2013 |

OTHER PUBLICATIONS

"Office Action of China Counterpart Application", issued on Aug. 12, 2013, p. 1-p. 4.
"Office Action of Taiwan Counterpart Application", issued on Nov. 25, 2013, p. 1-6.
"Second Office Action of China Counterpart Application", issued on Dec. 25, 2013, p. 1-4.

* cited by examiner

Primary Examiner — Theresa T Doan
(74) Attorney, Agent, or Firm — Jianq Chyun IP Office

(57) ABSTRACT

An active device including a source, a drain, an oxide semiconductor layer, a gate and a gate insulator layer is provided. The source includes first stripe electrodes parallel to each other and a first connection electrode connected thereto. The drain includes second stripe electrodes parallel to each other and a second connection electrode connected thereto, wherein the first stripe electrodes and the second stripe electrodes are parallel to each other, electrically isolated, and alternately arranged, and a zigzag trench is formed therebetween. The gate extends along the zigzag trench. The oxide semiconductor layer is in contact with the source and drain, wherein a contact area among the oxide semiconductor layer and each first stripe electrodes substantially equals to a layout area of each first stripe electrodes and a contact area among each second stripe electrodes substantially equals to a layout area of each second stripe electrodes.

8 Claims, 6 Drawing Sheets

ACTIVE DEVICE

CROSS-REFERENCE TO RELATED APPLICATION

This application claims the priority benefit of Taiwan application serial no. 100141252, filed on Nov. 11, 2011. The entirety of the above-mentioned patent application is hereby incorporated by reference herein and made a part of this specification.

BACKGROUND OF THE INVENTION

1. Field of the Invention

The invention is related to an active device, and in particular to an active device which has an oxide semiconductor layer.

2. Description of Related Art

Among various flat panel displays (FPDs), thin film transistor liquid crystal display (TFT-LCD) characterized by great space utilization, low power consumption, non-radiation, and low electromagnetic interference win popularity with consumers. In general, the TFT-LCD is mainly assembled by an active array substrate, a color filter substrate, and a liquid crystal (LC) layer sandwiched between the two substrates. The active array substrate has an active region and a peripheral circuit region. The active array is located within the active region and a driving circuit is located within the peripheral circuit region.

Taking the driving circuit located within the peripheral circuit region as an example, thin film transistors having a high ratio of channel width/channel length (W/L) are commonly used. In general, the current (Ion) of the TFT when being turned on is directly proportional to the ratio of width/length (W/L) of the channel, and it satisfies the following formula:

$$Ion = U*W/L(V_G - V_{th})V_D,$$

wherein U is carrier mobility, W is channel width, L is channel length, $V_G$ is gate voltage, $V_{th}$ is threshold voltage, and $V_D$ is drain voltage. As known from the above formula, the current (Ion) is increased by increasing the ratio of channel width/channel length (W/L). However, the increase in channel width usually affects the layout area to significantly increase. In order to reduce the layout area of the TFT, sources and drains are alternately arranged to increase the ratio of the channel width/channel length (W/L).

FIG. 1A is a schematic top view of a conventional active array substrate with multiple pairs of sources and drains disposed thereon. FIG. 1B is schematic view of the TFT taken along a sectional line A-A' depicted in FIG. 1A. Referring to FIG. 1A and FIG. 1B, the conventional TFT 100 is fabricated on a substrate 110 and includes a gate 120, a gate insulator layer 130, a semiconductor layer 140, an etch stop layer 150, a source 160 and a drain 170. The gate 120 is disposed on the substrate 110, while the gate insulator layer 130 is disposed on the substrate 110 to cover the gate 120. The semiconductor layer 140 is disposed on the gate insulator layer 130 over the gate 120. The etch stop layer 150 is disposed on the semiconductor layer 140. The source 160 and the drain 170 are disposed on the etch stop layer 150 and portions of the semiconductor 140, and the source 160 and the drain 170 are electrically isolated.

As shown in FIG. 1A, a zigzag trench Z is formed between the source 160 and the drain 170. Both the gate 120 and the semiconductor layer 140 extend along the zigzag trench Z, wherein the width $W_G$ of the gate 120 is greater the width $W_Z$ of the zigzag trench Z and the width $W_S$ of the semiconductor layer 140 is greater than the width $W_G$ of the gate 120. Moreover, the gate 120 has a plurality of stripe gaps $G_G$, the semiconductor layer 140 has a plurality of stripe gaps $G_S$, and the width of $G_S$ is smaller than the width of $G_G$.

Though the TFT 100 described in FIG. 1A and FIG. 1B already has a rather high ratio of channel width/channel length (W/L), along with the increasingly popularity of the slim border design of the FPDs, the layout area of the TFT 100 is required to further reduce. Accordingly, how to further reduce the required layout area of the TFT 100 under the condition of without reducing the ratio of channel width/channel length (W/L) has become the major development trend.

SUMMARY OF THE INVENTION

The invention provides an active device which improves the ratio of channel width/channel length (W/L) by altering the shapes of semiconductor layer.

The invention provides an active device including a source, a drain, an oxide semiconductor layer, a gate and a gate insulator layer. The source includes a plurality of first stripe electrodes parallel to each other and a first connection electrode connected to the first stripe electrodes. The drain includes a plurality of second stripe electrodes parallel to each other and a second connection electrode connected to the second stripe electrodes, wherein the first stripe electrodes and the second stripe electrodes are parallel to each other and alternately arranged between the first connection electrode and the second connection electrode. The source and the drain are electrically isolated and a zigzag trench is formed therebetween. Moreover, the oxide semiconductor layer is in contact with the source and the drain, wherein a contact area between the oxide semiconductor layer and each first stripe electrode substantially equals to a layout area of each first stripe electrode, and a contact area between the oxide semiconductor layer and each second stripe electrode equals to a layout area of each second stripe electrode. In addition, the gate insulator layer is disposed between the gate and the oxide semiconductor layer.

According to one embodiment of the invention, the first connection electrode is substantially parallel to the second connection electrode.

According to one embodiment of the invention, the source and the drain are electrically isolated.

According to one embodiment of the invention, the gate is located over or below the source and the drain.

According to one embodiment of the invention, the gate has a width greater than that of the zigzag trench.

According to an embodiment of the invention, the oxide semiconductor layer has a rectangle pattern.

According to an embodiment of the invention, a material of the oxide semiconductor layer includes Indium-Gallium-Zinc Oxide (IGZO), Zinc Oxide (ZnO), Tin Oxide (SnO), Indium-Zinc Oxide (IZO), Gallium-Zinc Oxide (GZO), Zinc-Tin Oxide (ZTO), or Indium-Tin Oxide (ITO).

Compared to the prior art, in the embodiment of the invention, by altering the shapes of semiconductor layer and thus in the same layout area, an active device has a higher ratio of channel width/channel length (W/L). In other words, compared to the prior art, in the embodiment of the invention, an active device having the same ratio of channel width/channel length (W/L) can be fabricated in a smaller layout area.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 2A:
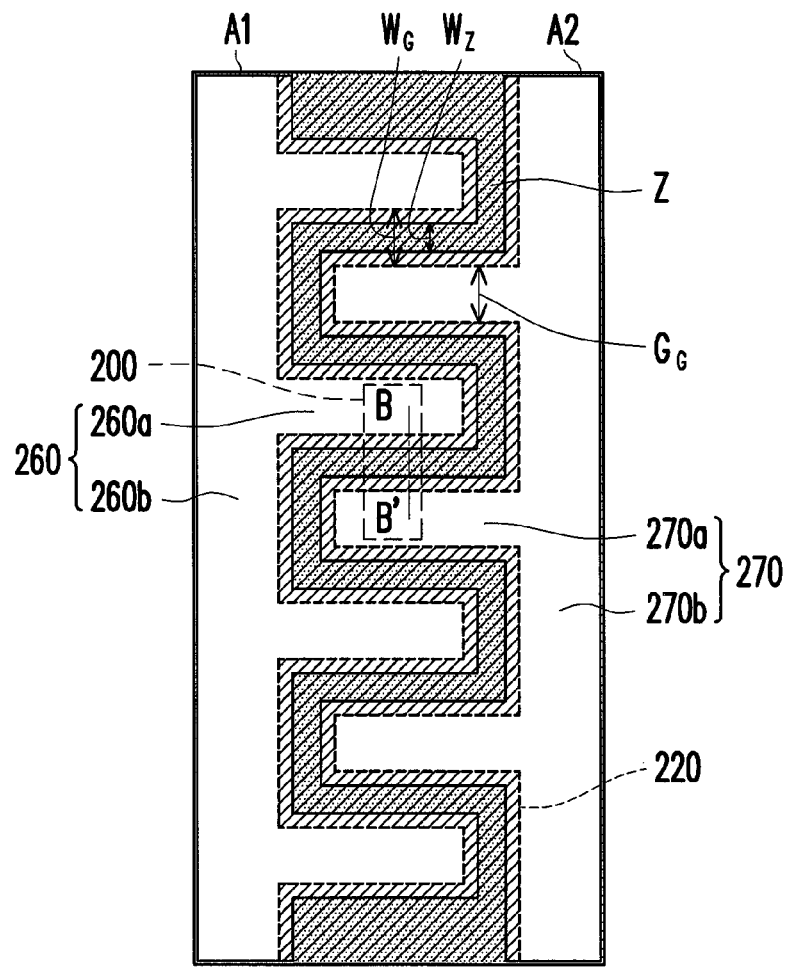
FIG. 2A is a schematic view illustrating a layout of an active device according to an embodiment of the invention.
Figure 2B:
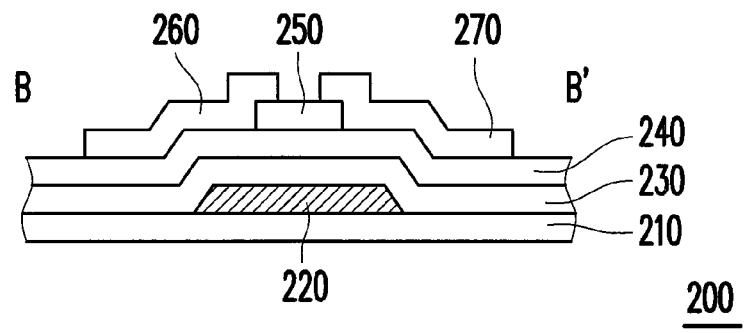
FIG. 2B is a schematic cross-sectional view taken along a sectional line B-B' depicted in FIG. 2A.

FIG. 2A is a schematic view illustrating a layout of an active device according to an embodiment of the invention. FIG. 2B is a schematic cross-sectional view taken along a sectional line B-B' depicted in FIG. 2A. Referring to FIG. 2A and FIG. 2B, the active device 200 of the embodiment is adapted to be fabricated on a substrate 210. The active device 200 includes a gate 220, a gate insulator layer 230, an oxide semiconductor layer 240, an insulating layer 250, a source 260 and a drain 270.

In this embodiment, the gate 220 is disposed on the substrate 210, and the material of the gate 220 is metal, for example. The gate insulator layer 230 is disposed on the gate 220. The material of the gate insulator layer is silicon dioxide ($SiO_2$), silicon nitride ($SiN_x$), or other suitable dielectric materials. The oxide semiconductor layer 240 is disposed on the gate insulator layer 230 and located over the gate 220 to be used as a channel layer. In the embodiment, a material of the oxide semiconductor layer includes, for example, Indium-Gallium-Zinc Oxide (IGZO), Zinc Oxide (ZnO), Tin Oxide (SnO), Indium-Zinc Oxide (IZO), Gallium-Zinc Oxide (GZO), Zinc-Tin Oxide (ZTO), or Indium-Tin Oxide (ITO). In addition, the material of the source 260 and the drain 270 is metal, for instance.

More specifically, as shown in FIG. 2A, the source 260 includes a plurality of first stripe electrodes 260a parallel to each other and a first connection electrode 260b connected to the first stripe electrodes 260a. The drain 270 includes a plurality of second stripe electrodes 270a parallel to each other and a second connection electrode 270b connected to the second stripe electrodes 270a, wherein the first connection electrodes 260b and the second connection electrodes 270b are parallel to each other. Additionally, the first stripe electrodes 260a and the second stripe electrodes 270a are parallel to each other, so that the ratio of channel width W to channel length L can be increased and the current (Ion) of the active device 200 when being turned on can further be improved. As clearly shown in FIG. 2A, a zigzag trench Z is formed between the first stripe electrodes 260a and the second stripe electrodes 270a, and the width of the zigzag trench Z is $W_Z$.

The gate 220 is located below the source 260 and the drain 270, and extends along the zigzag trench Z. Thus, the gate 220 has an outer profile similar to the zigzag trench Z. In addition, the gate 220 has a plurality of extending directions and a plurality of gaps $G_G$ parallel to the first stripe electrodes 260a and the second stripe electrodes 270a. In the embodiment, the width of the gap $G_G$ is, for example, between 3 μm to 15 μm.

In the embodiment, the width of the gate 220 $W_G$ is greater than the width of the zigzag trench Z $W_Z$ for example. And the first stripe electrodes 260a and the second stripe electrodes 270a is partially overlapped with the gate 220. Furthermore, the first stripe electrodes 260a and the second stripe electrodes 270a are respectively distributed at two opposite sides of the oxide semiconductor layer 240. And the first stripe electrodes 260a and the second stripe electrodes 270a are in contact with the oxide semiconductor layer 240, wherein a contact area between the oxide semiconductor layer 240 and each first stripe electrode 260a equals to a layout area A1 of each first stripe electrode 260a, and a contact area between the oxide semiconductor layer 240 and each second stripe electrode 270a equals to a layout area A2 of each second stripe electrode 270a. In the embodiment, the oxide semiconductor layer 240 has a rectangle pattern.

Figure 1A:
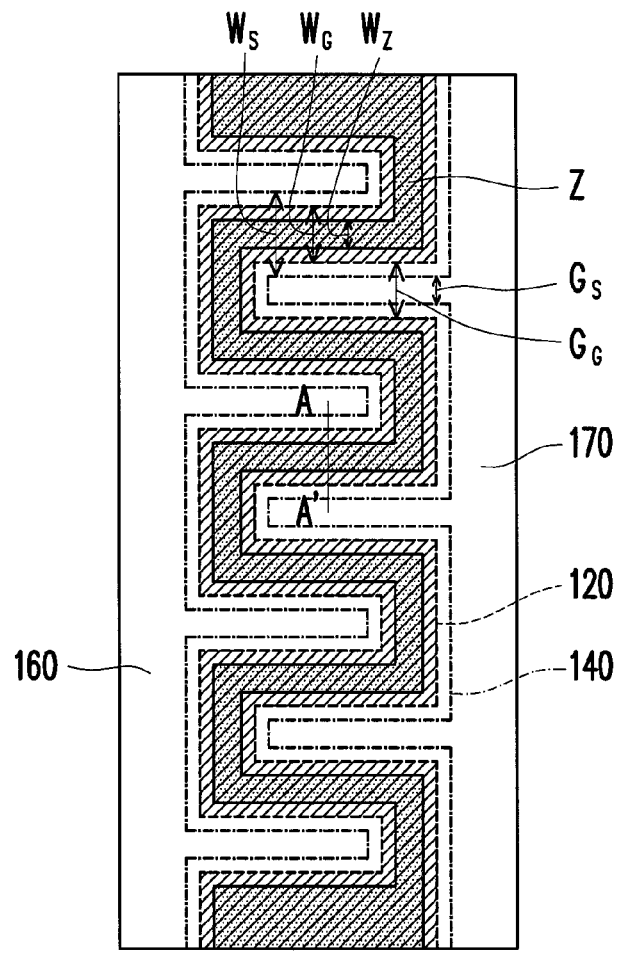
FIG. 1A is a schematic top view of a conventional active array substrate with multiple pairs of sources and drains disposed thereon.
Figure 1B:
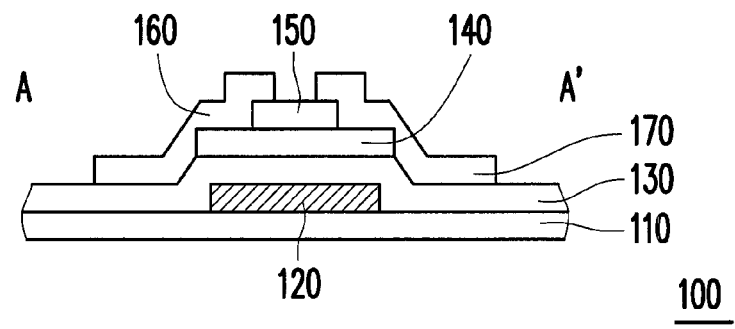
FIG. 1B is schematic view of the TFT taken along a sectional line A-A' depicted in FIG. 1A.

Since stripe gaps $G_S$ (as shown in FIG. 1A) are not formed in the layout region of the first stripe electrodes 260a and the second stripe electrodes 270a, which the oxide semiconductor layer 240 corresponds to, the active device 200 of the embodiment can provide a higher ratio of channel width/channel length (W/L) in the same layout area. In other words, in the embodiment of the invention, the active device 200 having the same ratio of channel width/channel length (W/L) can be fabricated in a smaller layout area.

In addition, since stripe gaps $G_S$ (as shown in FIG. 1A) are not formed in the layout region of the first stripe electrodes 260a and the second stripe electrodes 270a, which the oxide semiconductor layer 240 corresponds to, the oxide semiconductor layer 240 is conducive to improve the heat dissipation performance of the active device 200.

Figure 3A:
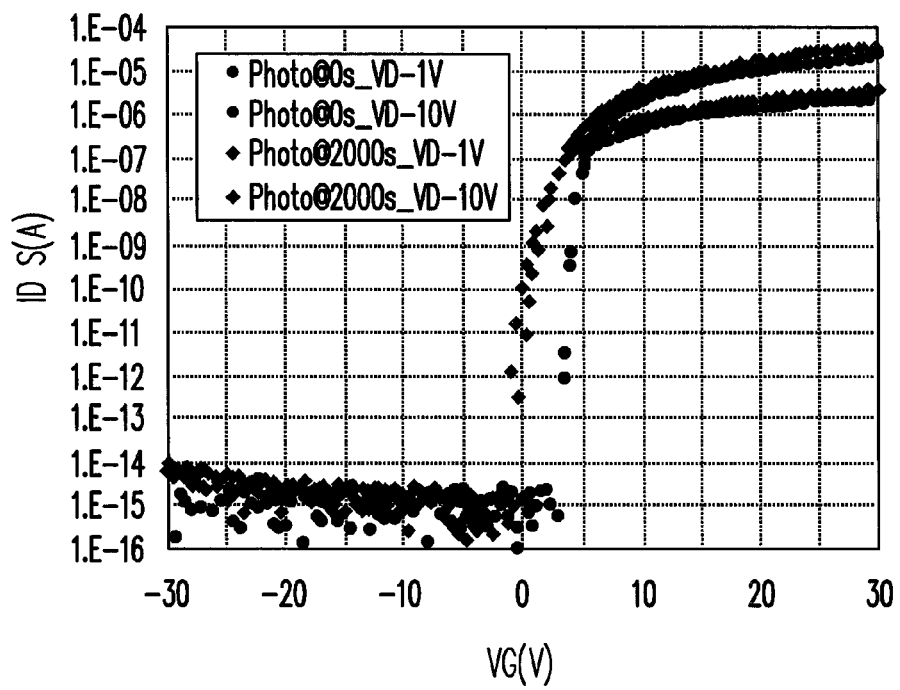
FIG. 3A illustrates a current-voltage curve (I-V curve) of a conventional active device.
Figure 3B:
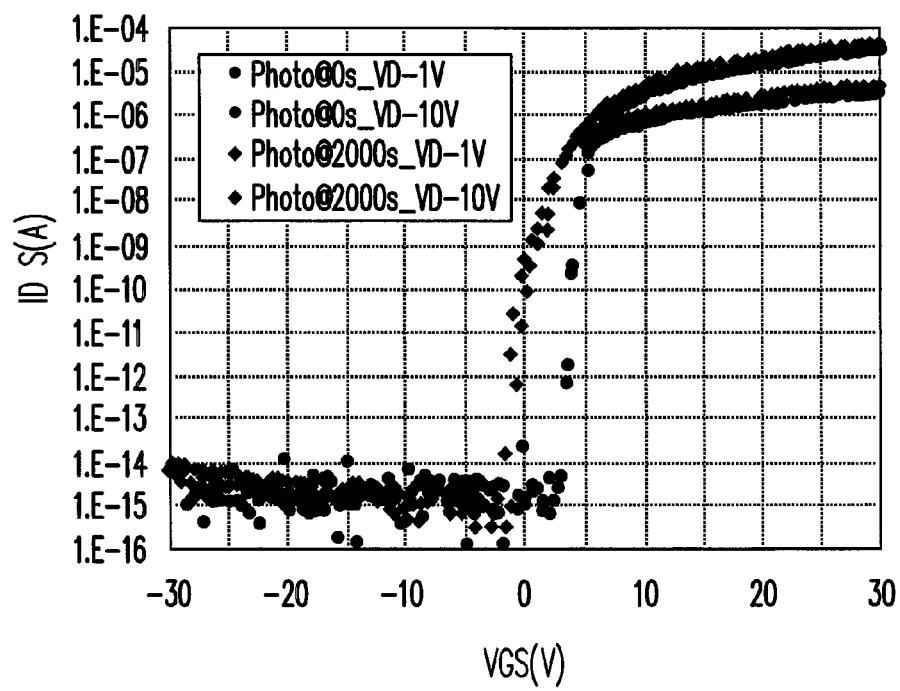
FIG. 3B illustrates a current-voltage curve (I-V curve) of the active device of the invention.

FIG. 3A and FIG. 3B respectively illustrate a current-voltage curve (I-V curve) of a conventional active device and the active device of the present invention. Referring to FIG. 3A and FIG. 3B, the curve "Photo@0s_VD-1V" means that the source of the active device is not irradiated by LED white light (2000 nits), where the gate voltage VG sweeps from −30 Volt to 30 Volt, and the drain voltage is 1 Volt. The curve "Photo@0s_VD-10V" means that the source of the active device is not irradiated by LED white light (2000 nits), where the gate voltage VG sweeps from −30 Volt to 30 Volt, and the drain voltage is 10 Volt. The curve "Photo@2000s_VD-1V" means that the source of the active device has been irradiated by LED white light (2000 nits) for 2000 second, where the gate voltage VG sweeps from −30 Volt to 30 Volt, and the drain voltage is 1 Volt. The curve "Photo@2000s_VD-10V" means that the source of the active device has been irradiated by LED white light (2000 nits) for 2000 second, where the gate voltage VG sweeps from −30 Volt to 30 Volt, and the drain voltage is 10 Volt. As shown in FIG. 3A and FIG. 3B, regardless of the voltage (small voltage or large voltage up to 30V), the current-voltage curve (I-V curve) of a conventional active device is similar to that of the active device of the invention.

Figure 4A:
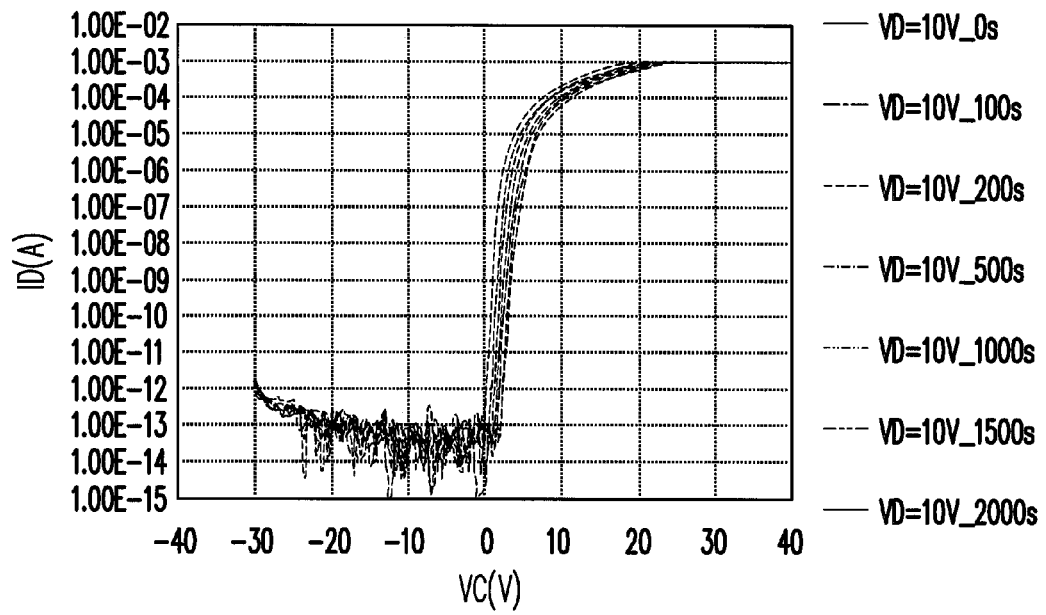
FIG. 4A illustrates a hot carrier stress curve of a conventional active device.
Figure 4B:
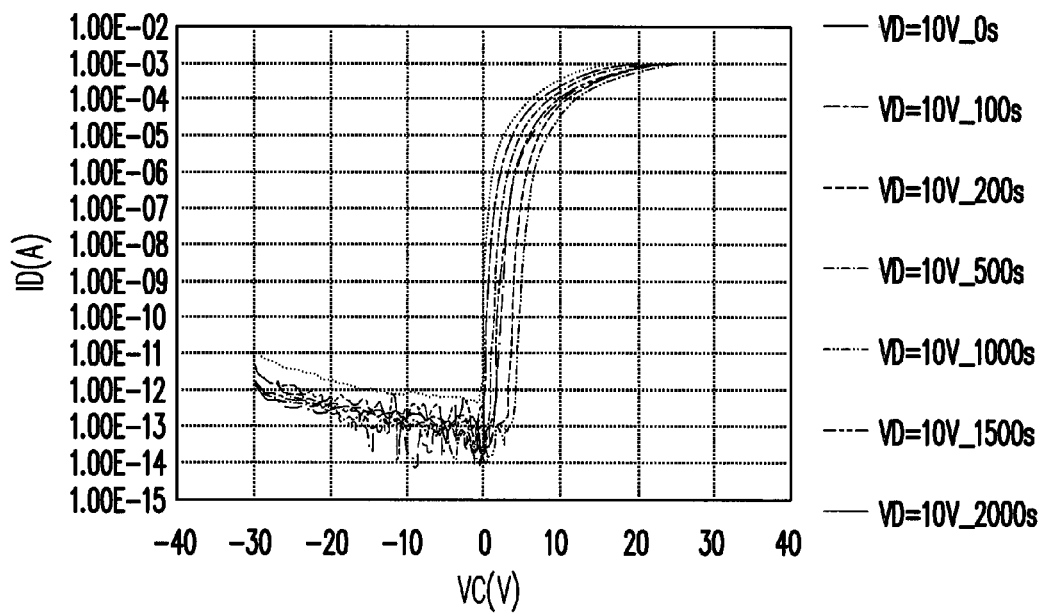
FIG. 4B illustrates a hot carrier stress curve of the active device of the invention.

FIG. 4A and FIG. 4B respectively illustrate a hot carrier stress curve of a conventional active device and the active device of the present invention. The hot carrier stress is mostly used to evaluate the reliability of active device. As shown in FIG. 4A and FIG. 4B, the hot carrier stress curve of a conventional active device is similar to that of the active device of the present invention.

Figure 5:
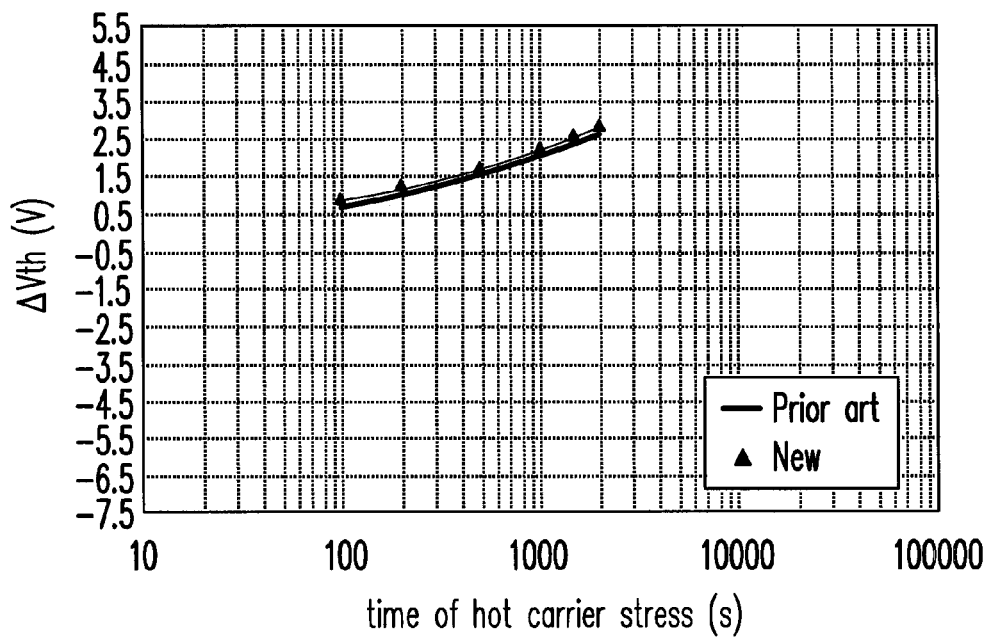
FIG. 5 illustrates threshold voltage-time curves of a conventional active device and the active device of the invention.

FIG. 5 illustrates threshold voltage-time curve of a conventional active device and the active device of the present invention. As shown in FIG. 5, the "New" curve represents the threshold voltage-time curve of the active device of the present invention, and the "Prior art" curve represents the threshold voltage-time curve of a conventional active device. The threshold voltage-time curve of a conventional active device is similar to that of the active device of the invention (all the shifts of the threshold voltage is between 0.5 V to 2.5 V).

Figure 6:
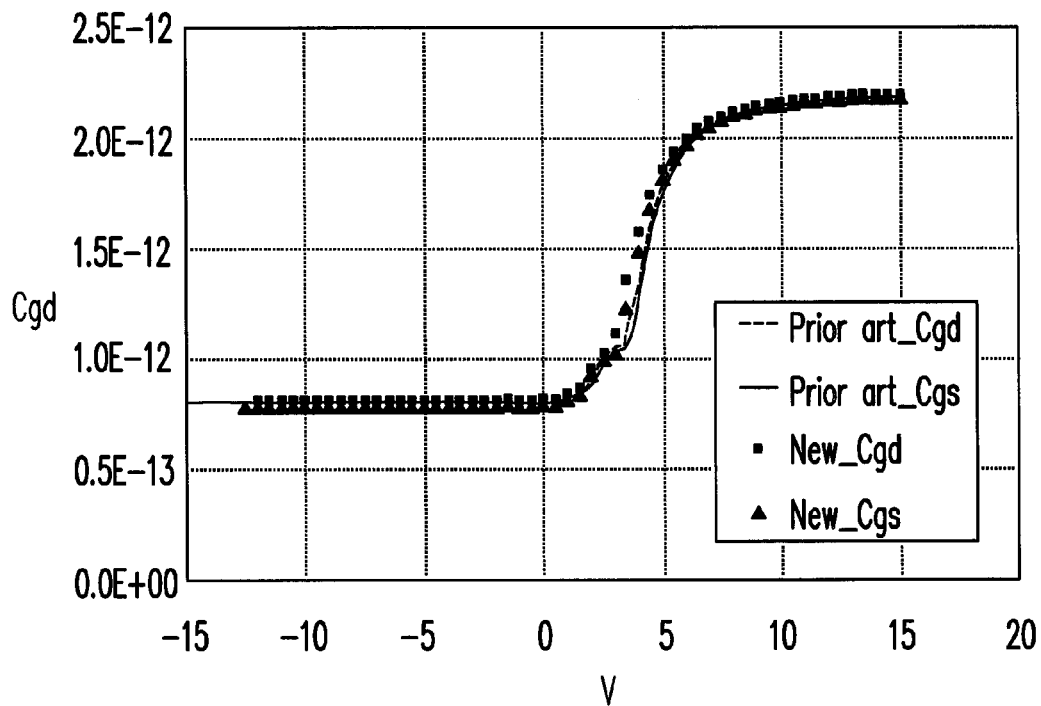
FIG. 6 illustrates capacitance-voltage curves of a conventional active device and the active device of the invention.

FIG. 6 illustrates capacitance-voltage curves of a conventional active device and the active device of the present invention. As shown in FIG. 6, the "New" curve represents the capacitance-voltage curve of the active device of the present invention, and the "Prior art" curve represents the capacitance-voltage curve of a conventional active device, wherein "Cgd" represents capacitance between the gate and the drain; "Priot Art_Cgd" represents capacitance between the gate and the drain in the prior art active device; "New_Cgd" represents capacitance between the gate and the drain in the active device of this application; "Priot Art_ Cgs" represents capacitance between the gate and the source in the prior art active device; and "New_Cgs" represents capacitance between the gate and the source in the active device of this application. As shown in FIG. 6, the capacitance-voltage curve of a conventional active device is similar to that of the active device of the invention.

Figure 7:
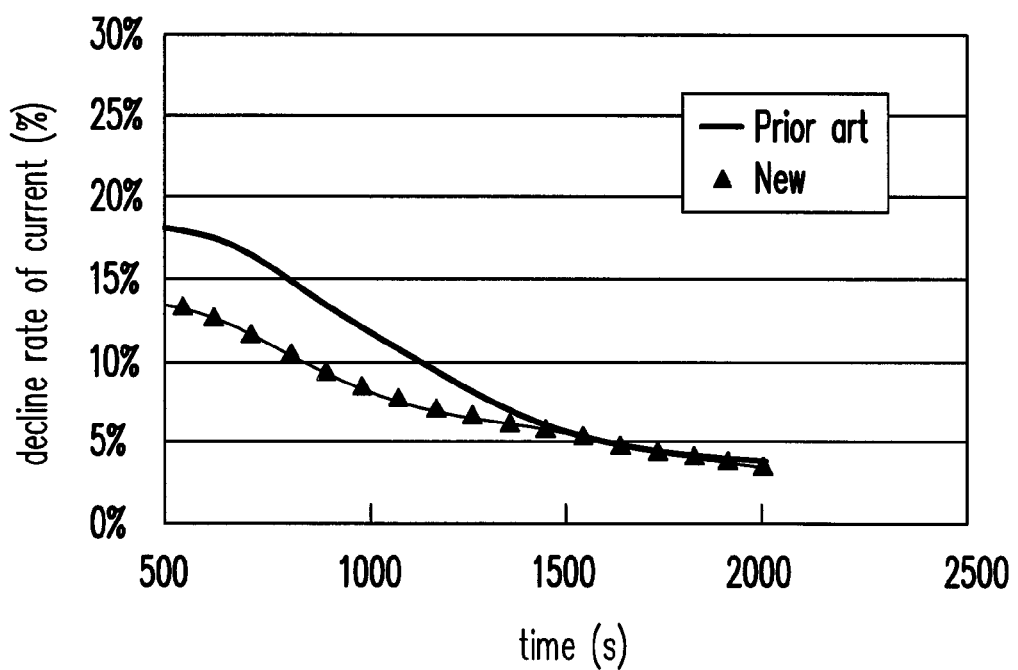
FIG. 7 is a figure of decline rate of current with time of a conventional active device and the active device of the invention is decreased with the time.

FIG. 7 is a figure of decline rate of current with time of a conventional active device and the active device of the invention is decreased with the time. As shown in FIG. 6, the "New" curve represents the curve of decline rate of current with time of the active device of the present invention, and the "Prior art" curve represents curve represents the curve of decline rate of current with time of a conventional active device. Referring to FIG. 7, the drain current of the active device of the invention is better than that of prior art. Thus, the active device of the invention is suitable to operate under the alternating voltage.

In light of the foregoing, the active device 200 of the present invention can provide a higher ratio of channel width/channel length (W/L) in a smaller layout area. In other words, the active device 200 of the invention having the same ratio of channel width/channel length (W/L) can be fabricated in a smaller layout area. Furthermore, the active device of the present invention has superior heat dissipation efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device, comprising:
   a source comprising a plurality of first stripe electrodes parallel to each other and a first connection electrode connected to the first stripe electrodes;
   a drain comprising a plurality of second stripe electrodes parallel to each other and a second connection electrode connected to the second stripe electrodes, wherein the first stripe electrodes and the second stripe electrodes are parallel to each other and alternately arranged between the first connection electrode and the second connection electrode, and the source and the drain are electrically isolated and a zigzag trench is formed therebetween;
   an oxide semiconductor layer in contact with the source and the drain, wherein a contact area between the oxide semiconductor layer and each first stripe electrode equals to a layout area of each first stripe electrode, and wherein a contact area between the oxide semiconductor layer and each second stripe electrode equals to a layout area of each second stripe electrode;
   a gate extending along the zigzag trench; and
   a gate insulator layer disposed between the gate and the oxide semiconductor layer.

2. The active device as claimed in claim 1, wherein the first connection electrode is substantially parallel to the second connection electrode.

3. The active device as claimed in claim 1, wherein the source and the drain are electrically isolated.

4. The active device as claimed in claim 1, wherein the gate has a width greater than that of the zigzag trench.

5. The active device as claimed in claim 1, wherein the oxide semiconductor layer has a rectangle pattern.

6. The active device as claimed in claim 1, wherein the gate is located over the source and the drain.

7. The active device as claimed in claim 1, wherein the gate is located below the source and the drain.

8. The active device as claimed in claim 1, wherein a material of the oxide semiconductor layer includes Indium-Gallium-Zinc Oxide (IGZO), Zinc Oxide (ZnO), Tin Oxide (SnO), Indium-Zinc Oxide (IZO), Gallium-Zinc Oxide (GZO), Zinc-Tin Oxide (ZTO), or Indium-Tin Oxide (ITO).

* * * * *